United States Patent [19]

Baumann

[11] Patent Number: 5,866,445
[45] Date of Patent: Feb. 2, 1999

[54] HIGH DENSITY CMOS CIRCUIT WITH SPLIT GATE OXIDE

[75] Inventor: Robert C. Baumann, Ibaraki-Ken, Japan

[73] Assignee: Texas Instruments Incorporated, Dallas, Tex.

[21] Appl. No.: 893,817

[22] Filed: Jul. 11, 1997

[51] Int. Cl.[6] .............................................. H01L 21/8238
[52] U.S. Cl. .......................... 438/199; 438/275; 257/401
[58] Field of Search ................................... 438/199, 275, 438/528; 257/77, 369, 351, 401

[56] References Cited

U.S. PATENT DOCUMENTS

| | | | |
|---|---|---|---|
| 4,866,002 | 9/1989 | Shizukuishi et al. | 437/34 |
| 5,315,143 | 5/1994 | Tsujji | 257/401 |
| 5,330,920 | 7/1994 | Soleimani et al. | 437/24 |
| 5,480,828 | 1/1996 | Hsu et al. | 438/275 |
| 5,528,056 | 6/1996 | Shimada et al. | 257/351 |
| 5,596,218 | 1/1997 | Soleimani et al. | 257/369 |
| 5,672,521 | 9/1997 | Barsan et al. | 438/528 |

FOREIGN PATENT DOCUMENTS 0 324 459 A2   7/1989   European Pat. Off. .

OTHER PUBLICATIONS

T. Kuroi et al., Novel NICE(Nitrogen Implantation into CMOS Gate Electrode and Source–Drain) Structure for High Reliability and High Performance 0.25 um Dual Gate CMOS, IEEE 1993, IEDM 93, pp. 325–328, Dec. 1993.
Patent abstracts of Japan, vol. 013, No. 270 (E776), 21 Jun., '89 & JP 01 061048 A (NEC Corp), 8 Mar. '89.
Patent abstracts of Japan, vol. 014, No. 108 (E–0896), 27 Feb. '90, & JP 01 309367 A (Fujitsu Ltd), 13 Dec. '89.
Patent abstracts of Japan, vol. 011, No. 217 (E–523), 14 Jul. '87 & JP 62 037959 A (Sony Corp), 18 Feb. '87.
Patent abstracts of Japan, vol. 007, No. 140 (E–182), 18 Jun. '83 & JP 58 054638 A (Mitsubishi Denki KK) 31 Mar. '83.
Patent abstracts of Japan, vol. 097, No. 008, 29 Aug. '97 & JP 09 092729 A (Mitsubishi Electric Corp) 4 Apr. '97.
High Performance 0–2 $\mu$m CMOS with 25 Å Gate Oxide Grown on Nitrogen Implanted Si Substrates, C. T. Liu, et al., 1996 IEEE.
Reliability of Gate Oxide Grown on Nitrogen Implanted SI Substrates, Chuan Lin, et al., appl. Phys. Lett 69 (24), 9 Dec., 1996, American Institute of Physics, ppa 3701–3702.
Effects of Residual Surface Nitrogen on the Dielectric Breakdown Characteristics of Regrown Oxides, J. Kim, et al., IEEE Electron Device Letters, vol. 14, No. 5, May 1993, ppa 265–267.
Oxynitride films formed by low energy NO+ Implantation into silicon, J. A. Diniz, et al., Appl. Phys. Lett. 69 (15), 7 Oct. 1996, American Institute of Physics, 2214–2215.

*Primary Examiner*—Olik Chaudhuri
*Assistant Examiner*—William David Coleman
*Attorney, Agent, or Firm*—Alan K. Stewart; Wade James Brady, III; Richard L. Donaldson

[57] ABSTRACT

A method for making a CMOS device includes: forming a PMOS region 60 of a first conductivity type; forming an NMOS region 62 of a second conductivity type adjacent the PMOS region 60; forming an insulating layer 64 and 66 over the PMOS region 60 and the NMOS region 62 such that the insulating layer is thinner over the PMOS region than over the NMOS region; forming a common gate 48 over the insulating layer 64 and 66; forming PMOS source/drain regions 40 and 42 of the second conductivity type in the PMOS region 60 and aligned to the common gate 48; and forming NMOS source/drain regions 44 and 46 of the first conductivity type in the NMOS region 62 and aligned to the common gate 48.

8 Claims, 2 Drawing Sheets

HIGH DENSITY CMOS CIRCUIT WITH SPLIT GATE OXIDE

FIELD OF THE INVENTION

This invention generally relates to electronic semiconductor devices. More specifically, the invention relates to CMOS transistors with split gate oxide.

BACKGROUND OF THE INVENTION

Most of the devices used in today's electronic components are based on Complementary Metal Oxide Semiconductor (CMOS). The base building block of all digital CMOS circuits combines a PMOS and NMOS transistor to form an inverter. The CMOS circuit inverts the incoming signal with the complementary action of the NMOS and PMOS transistors. One issue with all CMOS circuits is the fact that the drive capability of the PMOS is several times lower than that of the NMOS device of the same geometry. This effect is due to the fact that the majority carriers in PMOS devices are holes which have lower mobility than electrons.

The most common solution to the asymmetry in PMOS and NMOS drive currents is to design the PMOS devices with wider gates to allow more drive current for a given gate voltage. This simple solution allows balancing of the NMOS and PMOS characteristics but at expense to silicon real estate. In typical implementations a balanced CMOS arrangement would be a PMOS with a gate width two to three times larger than that of the NMOS device, as shown by the prior art device in FIG. 1.

The prior art CMOS inverter layout, shown in FIG. 1, includes source and drain regions 20 and 22 for the PMOS transistor, source and drain regions 24 and 26 for the NMOS transistor, common gate 28, conductive lines 30, 32, and 34, input voltage $V_{in}$, output voltage $V_{out}$, and reference voltages $V_{high}$ and $V_{low}$. The common gate 28 of the NMOS and PMOS serves as the input. The source 24 of the NMOS and the drain 22 of the PMOS are tied together by conductive line 30 which serves as the inverter output. Finally, conductive line 32 connects the source 20 of the PMOS transistor to voltage reference $V_{high}$, and conductive line 34 connects the drain 26 of the NMOS transistor to voltage reference $V_{low}$. In the prior art device of FIG. 1, the PMOS width $W_p$ is approximately 2.5 times the NMOS width $W_n$.

SUMMARY OF THE INVENTION

Generally, and in one form of the invention, a method for making a CMOS device includes: forming a PMOS region of a first conductivity type; forming an NMOS region of a second conductivity type adjacent the PMOS region; forming an insulating layer over the PMOS region and the NMOS region such that the insulating layer is thinner over the PMOS region than over the NMOS region; forming a common gate over the insulating layer; forming PMOS source/drain regions of the second conductivity type in the PMOS region and aligned to the common gate; and forming NMOS source/drain regions of the first conductivity type in the NMOS region and aligned to the common gate.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
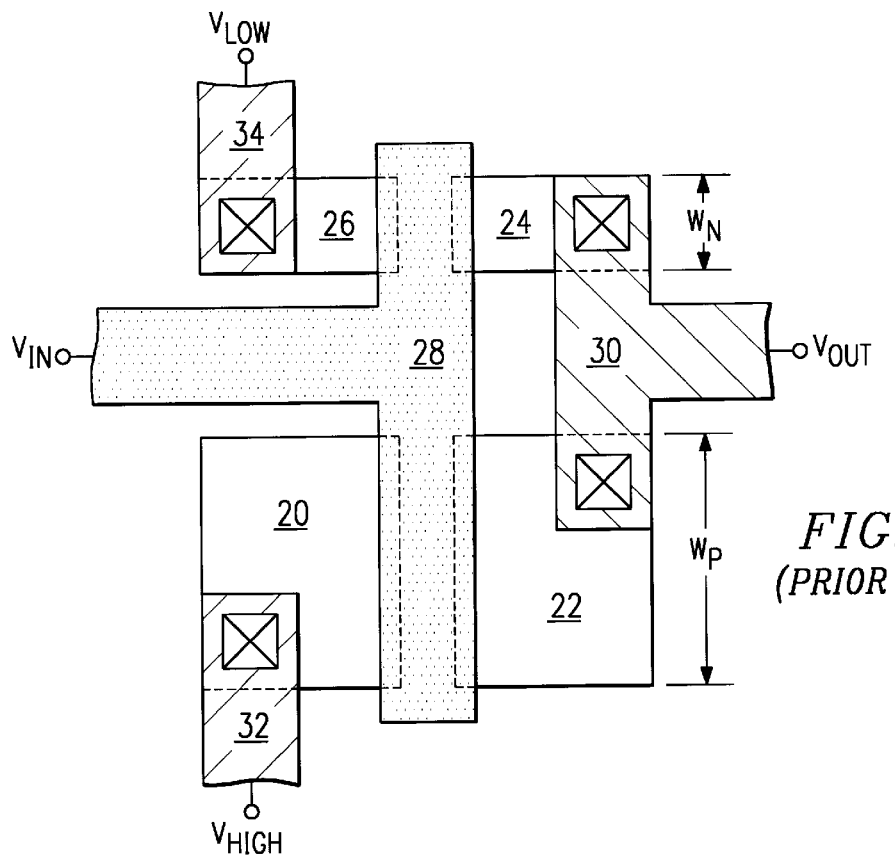
FIG. 1 is a plan view of a prior art CMOS device.
Figure 2:
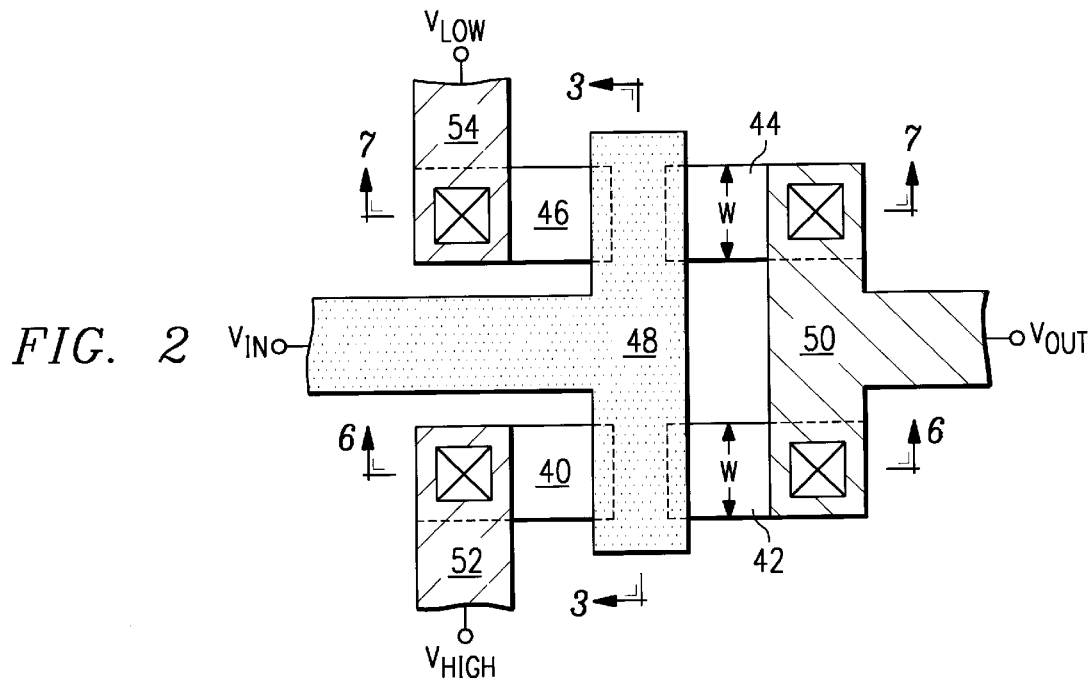
FIG. 2 is a plan view of a preferred embodiment split gate oxide CMOS device.

By using two different gate oxide (insulator) thicknesses for the PMOS and NMOS transistors, a greatly reduced cell size is achieved in CMOS devices. This approach works because the drive current of NMOS and PMOS field effect transistors is a function of:

$$I_d \sim W \cdot C_i = W \cdot (\epsilon_i / d)$$

Where $I_d$ is the drive current, W is the gate width, and d is the gate insulator thickness. As shown by the above equation, the drive current increases linearly with increases in gate width and decreases in gate thickness. A process which can allow PMOS gate oxides to be thinner has a similar effect on increasing drive current as a design which increases the PMOS gate width. By controlling the gate insulator thickness, an inverter circuit layout with identical gate widths for the PMOS and NMOS devices is provided, as shown in FIG. 2. This layout is achieved with a PMOS having a gate insulator which is roughly half as thick as the NMOS transistor gate insulator.

FIG. 2 is a plan view of a preferred embodiment split gate oxide CMOS device. The device of FIG. 2 includes source and drain regions 40 and 42 for the PMOS transistor, source and drain regions 44 and 46 for the NMOS transistor, common gate 48 which serves as the PMOS gate and the NMOS gate, conductive lines 50, 52, and 54, input voltage $V_{in}$, output voltage $V_{out}$, and reference voltages $V_{high}$ and $V_{low}$. The common gate 48 of the NMOS and PMOS serves as the input. The source 44 of the NMOS and the drain 42 of the PMOS are tied together by conductive line 50 which serves as the inverter output. Conductive line 52 connects the source 40 of the PMOS transistor to voltage reference $V_{high}$, and conductive line 54 connects the drain 46 of the NMOS transistor to voltage reference $V_{low}$. In the preferred embodiment of FIG. 2, the PMOS and NMOS have the same width W.

Figure 3:
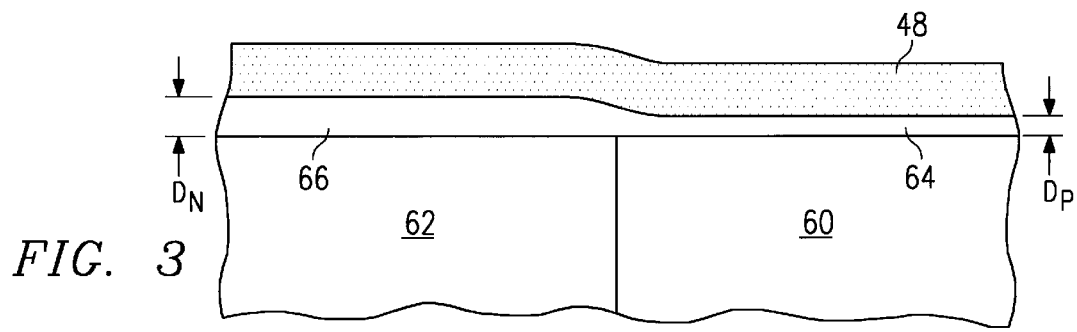
FIG. 3 is cross-sectional diagram of the device of FIG. 2.
Figure 4:
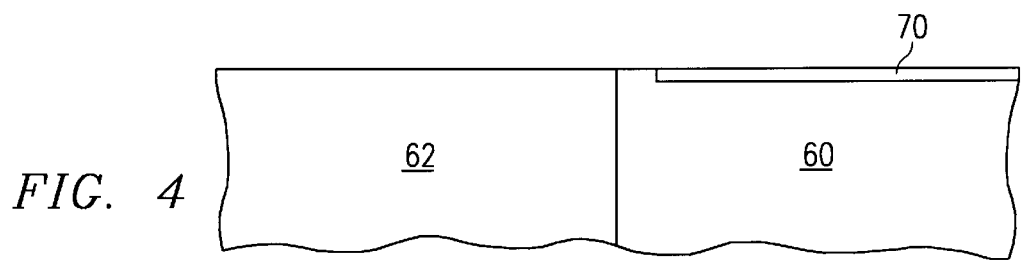
FIGS. 4 and 5 are cross-sectional views showing the device of FIG. 3 at two stages of fabrication.
Figure 5:
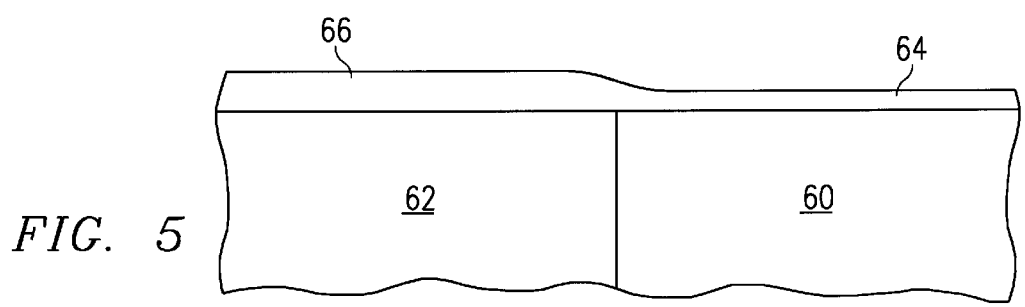

FIG. 3 is cross-sectional diagram of the device of FIG. 2. FIG. 3 includes common gate 48, N type PMOS region 60, P type NMOS region 62, PMOS oxide region 64 (PMOS insulator), NMOS oxide region 66 (NMOS insulator), PMOS oxide thickness $D_P$, and NMOS oxide thickness $D_N$. In the preferred embodiment, the PMOS oxide thickness $D_P$ is about half the NMOS oxide thickness $D_N$. FIGS. 4 and 5, show the device of FIG. 3 at two stages of fabrication.

One simple way to create the split gate oxide is to implant or surface treat the PMOS gate surfaces prior to oxidation with a substance such as nitrogen. Nitrogen impedes the growth of oxides by altering the surface reaction rates. A process which introduces nitrogen at the PMOS gate silicon is therefore the preferred method of assuring that the PMOS gate oxides will be thinner than their NMOS counter parts for the same oxidation process. B. Doyle et al., "Simultaneous Growth of Different Thickness Gate Oxides in Silicon CMOS Processing", IEEE Elec. Dev. Lett., V16.7, 1995, discloses such an impact on gate oxides, and reports that implanted nitrogen can suppress growth rates by at least a factor of two. The use of nitrogen implantation also avoids the extra process steps and negative yield impact of other split gate technologies.

Referring to FIGS. 4 and 5, a method of forming the preferred embodiment of FIG. 3 is described in detail. FIG. 4 illustrates the P type PMOS region 60 and the N type NMOS region 62. The surface is patterned and nitrogen is implanted followed by an anneal to form nitrogen implant region 70, shown in FIG. 4. Next, oxide regions 64 and 66 are grown, as shown in FIG. 5. Then epitaxial layer (common gate) 48 is then formed over oxide regions 64 and 66, as shown in FIG. 3.

Figure 6:
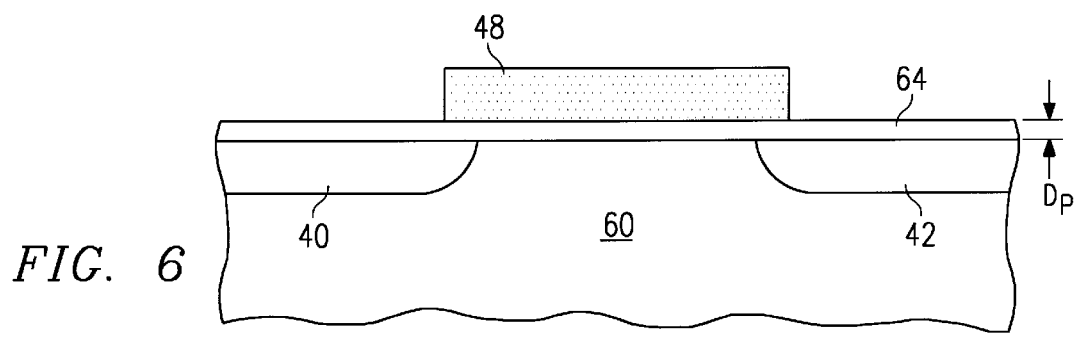
FIG. 6 is a cross-sectional diagram of the device of FIG. 2 showing the source/drain regions of the PMOS device.
Figure 7:
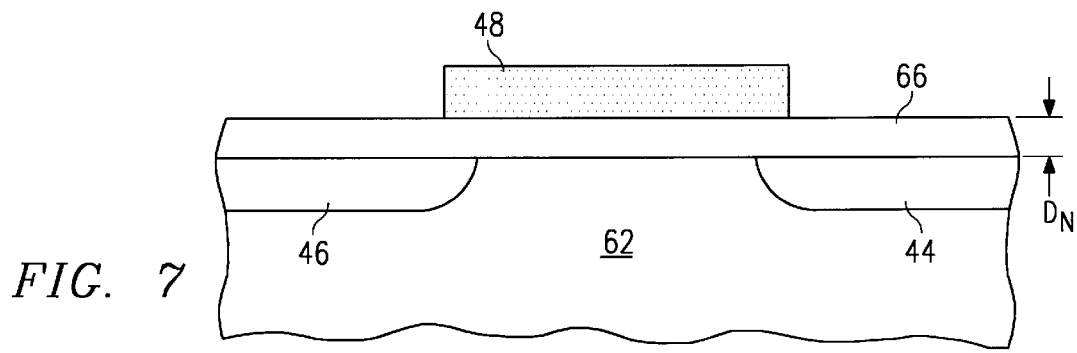
FIG. 7 is a cross-sectional diagram of the device of FIG. 2 showing the source/drain regions of the NMOS device.

The source/drain regions 40, 42, 44, and 46, shown in FIGS. 6 and 7, are then formed by methods well known in the art. FIG. 6 is a cross section of the source/drain regions of the PMOS transistor. FIG. 6 includes P type PMOS source 40, P type PMOS drain 42, N type region 60, PMOS oxide region 64, common gate 48 (PMOS gate), and PMOS oxide thickness $D_P$. FIG. 7 is a cross section of the source/drain regions of the NMOS transistor. FIG. 7 includes N type NMOS source 44, N type NMOS drain 46, P type region 62, NMOS oxide region 66, common gate 48 (NMOS gate), and NMOS oxide thickness $D_N$.

The preferred embodiment split gate oxide CMOS device provides the advantage of reduced chip area for CMOS devices including circuits with repetitive CMOS components such as SRAM and DRAM devices.

A preferred embodiment has been described in detail hereinabove. It is to be understood that the scope of the invention also comprehends embodiments different from those described, yet within the scope of the claims.

For example, a process which increases the growth rate of the NMOS gate oxide could be used instead of a process which reduces the growth rate of the PMOS oxide. Also, combinations of these two processes could be used to obtain the optimum oxide growth rates.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description.

It is therefore intended that the appended claims encompass any such modifications or embodiments.

What is claimed is:

1. A method for making a CMOS device comprising:

forming a PMOS region of a first conductivity type;

forming an NMOS region of a second conductivity type adjacent the PMOS region;

forming an insulating layer over the PMOS region and the NMOS region such that the insulating layer is thinner over the PMOS region than over the NMOS region;

forming a common gate over the insulating layer;

forming PMOS source/drain regions of the second conductivity type in the PMOS region and aligned to the common gate; and forming NMOS source/drain regions of the first conductivity type in the NMOS region and aligned to the common gate.

2. The method of claim 1 wherein the insulating layer is oxide.

3. The method of claim 2, before the step of forming the insulating layer, further comprising treating a portion of a surface of the PMOS region to slow oxide growth rate in that portion of the surface.

4. The method of claim 3 wherein the step of treating a portion of a surface comprises treating the surface with nitrogen.

5. The method of claim 3 wherein the thickness of the insulating layer over the treated portion is less than two-thirds the thickness of the insulating layer over the NMOS region.

6. The method of claim 1 further comprising a conductive line coupled to the drain of the NMOS and the source of the PMOS.

7. The method of claim 3 wherein the step of treating a portion of a surface of the PMOS region comprises implanting nitrogen into the surface of the PMOS region.

8. The method of claim 1 wherein the PMOS source/drain regions are the same width as the NMOS source/drain regions.

* * * * *